(12) United States Patent
Park et al.

(10) Patent No.: US 9,478,304 B2
(45) Date of Patent: Oct. 25, 2016

(54) SEMICONDUCTOR MEMORY DEVICE AND OPERATING METHOD THEREOF

(71) Applicant: SK hynix Inc., Gyeonggi-do (KR)

(72) Inventors: Min Sang Park, Chungcheongbuk-do (KR); Yun Bong Lee, Chungcheongbuk-do (KR); Suk Kwang Park, Chungcheongbuk-do (KR); Hwang Huh, Chungcheongbuk-do (KR); Dong Wook Lee, Seoul (KR); Myung Su Kim, Gyeonggi-do (KR); Sung Hoon Cho, Gyeonggi-do (KR); Sang Jo Lee, Chungcheongbuk-do (KR); Chang Jin Sunwoo, Chungcheongbuk-do (KR); Gil Bok Choi, Daejeon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/592,672

(22) Filed: Jan. 8, 2015

(65) Prior Publication Data

US 2016/0049200 A1  Feb. 18, 2016

(30) Foreign Application Priority Data

Aug. 18, 2014  (KR) .......................... 10-2014-0107220

(51) Int. Cl.
*G11C 16/34* (2006.01)
*G11C 16/10* (2006.01)
*G11C 16/26* (2006.01)
*G11C 16/04* (2006.01)
*G11C 11/56* (2006.01)

(52) U.S. Cl.
CPC ....... *G11C 16/3459* (2013.01); *G11C 11/5628* (2013.01); *G11C 16/3454* (2013.01); *G11C 16/3486* (2013.01); *G11C 2211/5621* (2013.01); *G11C 2211/5622* (2013.01)

(58) Field of Classification Search
CPC .......... G11C 16/2459; G11C 16/2454; G11C 16/3459; G11C 16/3486; G11C 16/3454
USPC ............. 365/185.19, 185.22, 185.24, 185.28
See application file for complete search history.

(56) References Cited

U.S. PATENT DOCUMENTS

| | | | | |
|---|---|---|---|---|
| 5,537,358 A | * | 7/1996 | Fong | G11C 16/16 365/185.29 |
| 2010/0208524 A1 | * | 8/2010 | Sarin | G11C 16/10 365/185.19 |
| 2011/0103151 A1 | * | 5/2011 | Kim | G11C 11/5628 365/185.19 |
| 2013/0044548 A1 | * | 2/2013 | Lo | G11C 16/10 365/185.22 |

FOREIGN PATENT DOCUMENTS

| | | |
|---|---|---|
| KR | 1020100107291 | 10/2010 |
| KR | 1020130063191 | 6/2013 |

* cited by examiner

*Primary Examiner* — Ly D Pham
(74) *Attorney, Agent, or Firm* — I P & T Group LLP

(57) ABSTRACT

A method of operating a semiconductor memory device includes performing a first program operation to simultaneously increase threshold voltages of memory cells having different target levels to sub-levels lower than the different target levels, verifying the memory cells by using different verify voltages, respectively, performing a second program operation to divide the threshold voltages of the memory cells, and performing a third program operation to increase the threshold voltages of the memory cells to the different target levels, respectively.

15 Claims, 12 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2014-0107220, filed on Aug. 18, 2014, the entire disclosure of which is herein incorporated by reference in its entirety.

BACKGROUND

Field of Invention

Various exemplary embodiments relate generally to a semiconductor memory device and an operating method thereof, and more particularly, to a program method of a semiconductor memory device.

A semiconductor device may include a memory cell array in which data is stored. The memory cell array may include a plurality of memory blocks. Each of the memory blocks may include a plurality of memory cells.

A single level cell (SLC) mode in which one bit of information is stored in a single memory cell has been used. However, research has been conducted on technology for storing more than one bit of information in a single memory cell in order to increase data capacity and reduce manufacturing costs. For example, two bits of information is stored in a single memory cell in a multi level cell (MLC) mode and three bits of information is stored in a single memory cell in a triple level cell (TLC) mode. Recently, research has been actively conducted on a quadruple level cell (QLC) mode in which four bits of information is stored in a single memory cell.

However, when a data storage method advances from SLC mode to MLC, TLC and QLC modes, the semiconductor memory device may need to perform more complicated operations. As a result, operating time may be increased, and the life of the semiconductor memory device may be reduced.

SUMMARY

An embodiment is directed to a semiconductor memory device capable of reducing a program operating time and reducing threshold voltage distribution width, and an operating method thereof.

A method of operating a semiconductor memory device according to an embodiment includes performing a first program operation to simultaneously increase threshold voltages of memory cells having different target levels to sub-levels lower than the different target levels, verifying the memory cells by using different verify voltages, respectively, performing a second program operation to divide the threshold voltages of the memory cells, and performing a third program operation to increase the threshold voltages of the memory cells to the different target levels, respectively.

A method of operating a semiconductor memory device according to an embodiment includes performing a first program operation to increase threshold voltages of first, second and third memory cells having first, second and third target levels different from one another, respectively, to sub-levels lower than the different target levels, performing a first verify operation to verify the first memory cells by using a first verify voltage, performing a second verify operation to verify the second memory cells by using a second verify voltage, performing a third verify operation to verify the third memory cells by using a third verify voltage, performing a second program operation to divide the threshold voltages of the first to third memory cells, and performing a third program operation to program the first, second and third memory cells, wherein the threshold voltages of the first, second and third memory cells are greater than the first, second and third target levels, respectively.

A method of operating semiconductor memory device according to an embodiment includes defining a plurality of memory cell groups each including memory cells having different target levels, performing a first program operation on the plurality of memory cell groups to have different threshold voltage distributions, verifying the memory cells having the different target levels by using different verify voltages, performing a second program operation to divide the memory cells into different threshold voltage distributions, and performing a third program operation to increase threshold voltages of the memory cells to the different target levels, respectively.

A semiconductor memory device according to an embodiment includes a memory cell array including a plurality of memory cells storing data, a peripheral circuit suitable for performing program, read and erase operations on the plurality of memory cells, and a control circuit suitable for controlling the peripheral circuit to perform a first program operation to increase threshold voltages of first memory cells having different target levels, among the memory cells, to sub-levels lower than the different target levels at the same time, verify the first memory cells by using different verify voltages, respectively, perform a second program operation to divide the threshold voltages of the first memory cells, and perform a third program operation to increase the threshold voltages of the memory cells to be greater than the different target levels, respectively.

A method of operating a semiconductor memory device according to an embodiment includes programming first memory cells having a first program target level and second memory cells having a second program target level, different from the first program target level, to have a first threshold voltage distribution by using a first program pulse, verifying the first memory cells and the second memory cells by using first and second verify voltages different from each other, respectively, programming the first memory cells and the second memory cells to have second and third threshold voltage distributions different from each other, respectively, by using a second program pulse, and programming the first memory cells and the second memory cells to increase threshold voltages thereof to the first and second program target levels, respectively.

DETAILED DESCRIPTION

Figure 1:
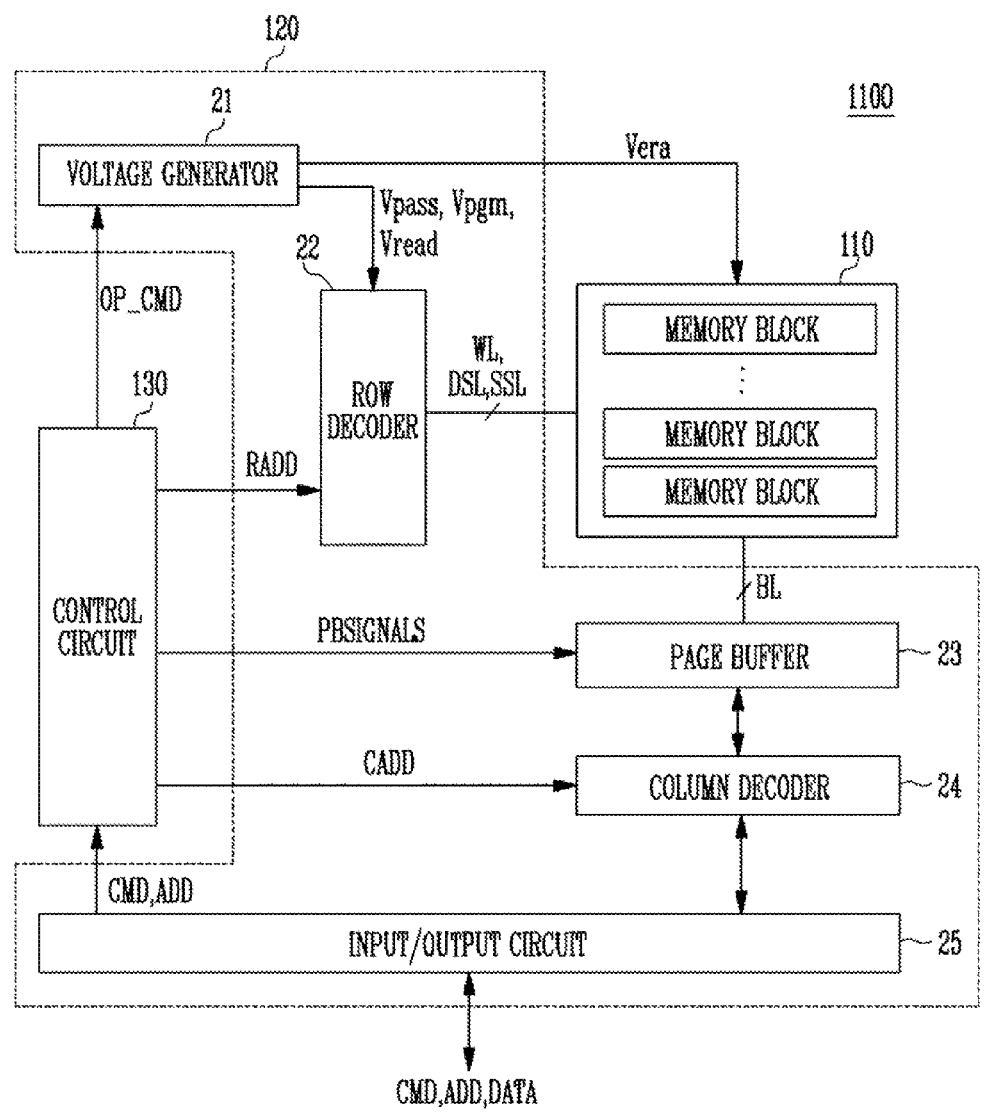
FIG. 1 is a schematic diagram illustrating a memory device according to an embodiment of the present invention.

Hereinafter, various exemplary embodiments will be described in detail with reference to the accompanying drawings. In the drawings, thicknesses and lengths of components may be exaggerated for convenience of illustration. In the following description, a detailed explanation of related functions and constitutions may be omitted for simplicity and conciseness. Like reference numerals refer to like elements throughout the specification and drawings.

The figures are provided to allow those with ordinary skill in the art to enable and understand the scope of the present invention. The present invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art.

FIG. 1 is a schematic diagram illustrating a semiconductor memory device according to an embodiment of the present invention.

Referring to FIG. 1, a semiconductor memory device 1100 may include a memory cell array 110 storing data, a peripheral circuit 120 performing program, read and erase operations on the memory cell array 110, and a control circuit 130 controlling the peripheral circuit 120.

The memory cell array 110 may include a plurality of memory blocks. The memory blocks may have a two-dimensional or three-dimensional structure. For example, two-dimensional memory blocks may include a plurality of strings arranged horizontally on a semiconductor substrate. Three-dimensional memory blocks may include a plurality of strings arranged horizontally and stacked on the semiconductor substrate. Each of the strings may include a drain selection transistor, memory cells and a source selection transistor coupled in series between bit lines BL and a common source line.

The peripheral circuit 120 may include a voltage generator 21, a row decoder 22, a page buffer 23, a column decoder 24 and an input/output circuit 25.

The voltage generator 21 may generate operating voltages having various levels in response to an operating command signal OP_CMD. The operating command signal OP_CMD may include a program command signal, a read command signal and an erase command signal. For example, the voltage generator 21 may generate an erase voltage Vera, a program voltage Vpgm, a read voltage Vread, a pass voltage Vpass and other voltages having various levels. The erase voltage Vera may be transferred to a selected memory block, and the other voltages including the program voltage Vpgm, the read voltage Vread and the pass voltage. Vpass may be transferred to the row decoder 22.

The row decoder 22 may select one of the memory blocks included in the memory cell array 110 in response to a row address RADS and transfer the operating voltages to word lines WL, drain selection lines DSL and source selection lines SSL coupled to the selected memory block.

The page buffer 23 may be coupled to the memory blocks through the bit lines BL, exchange data with the selected memory block during program, read and erase operations, and temporarily store the transferred data.

The column decoder 24 may exchange data with the page buffer 23 in response to a column address CADD.

The input/output circuit 25 may transfer a command signal CMD and an address ADD, which are transferred from an external device, to the control circuit 130, transfer the externally transferred data DATA to the column decoder 24, and output or transfer the data DATA transferred from the column decoder 24 to an external device or the control circuit 130.

The control circuit 130 may control the peripheral circuit 120 in response to the command signal CMD and the address ADD. For example, the control circuit 130 may control the peripheral circuit 120 to perform the program operation, the read operation or the erase operation in response to the command signal CMD and the address ADD.

Figure 2:
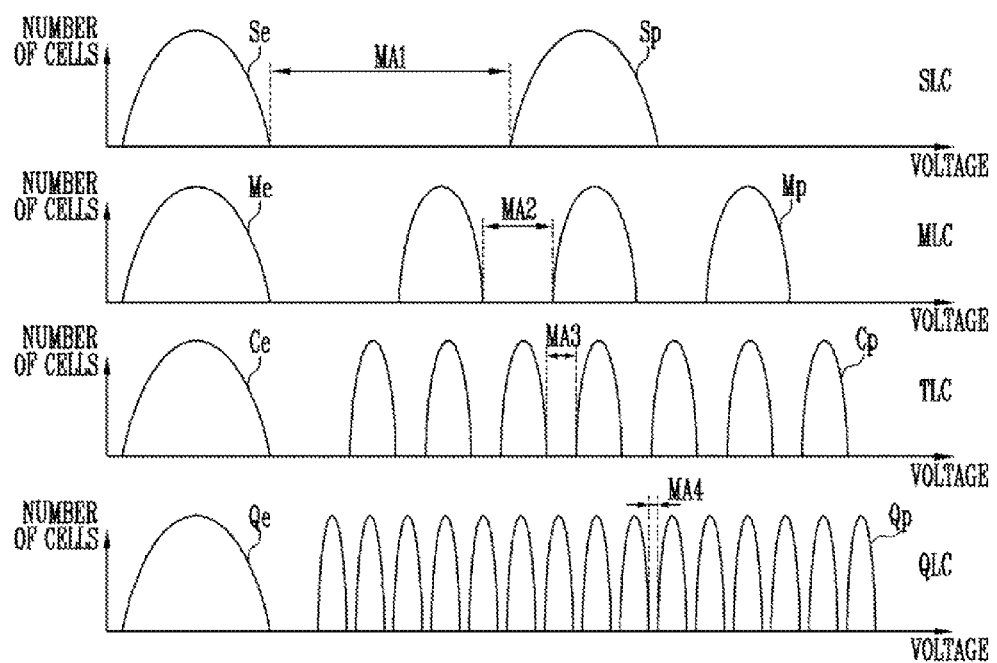
FIG. 2 is a view illustrating threshold voltage distributions according to various program methods.

FIG. 2 is a diagram illustrating threshold voltage distributions according to various program methods.

Referring to FIG. 2, a semiconductor memory device may include a plurality of memory cells in which data is stored. A program method may vary depending on the number of bits to be stored in each memory cell.

In a single level cell (SLC) mode in which one bit of information is stored in a single memory cell, memory cells may be divided into an erase state Se and one program state Sp based on threshold voltage distributions thereof.

In a multi level cell (MLC) mode in which two bits of information are stored in a single memory cell memory cells may be divided to an erase state Me and three program states Mp based on threshold voltage distributions thereof.

In a triple level cell (TLC) mode in which three bits of information are stored in a single memory cell memory cells may be divided into an erase state Ce and seven program states Cp based on threshold voltage distributions thereof.

In a quadruple level cell (QLC) mode in which four bits of information is stored in a single memory cell, memory cells may be divided into an erase state Qe and fifteen program states Qp based on threshold voltage distributions thereof.

As a program method advances from the SLC mode to the QLC mode, the number of threshold voltage distributions may increase. Thus, program operating time may increase, and distances MA1, MA2, MA3 and MA4 between the threshold voltage distributions may be reduced.

A program method for reducing a program operating time and a threshold voltage distribution width is described below.

Figure 3:
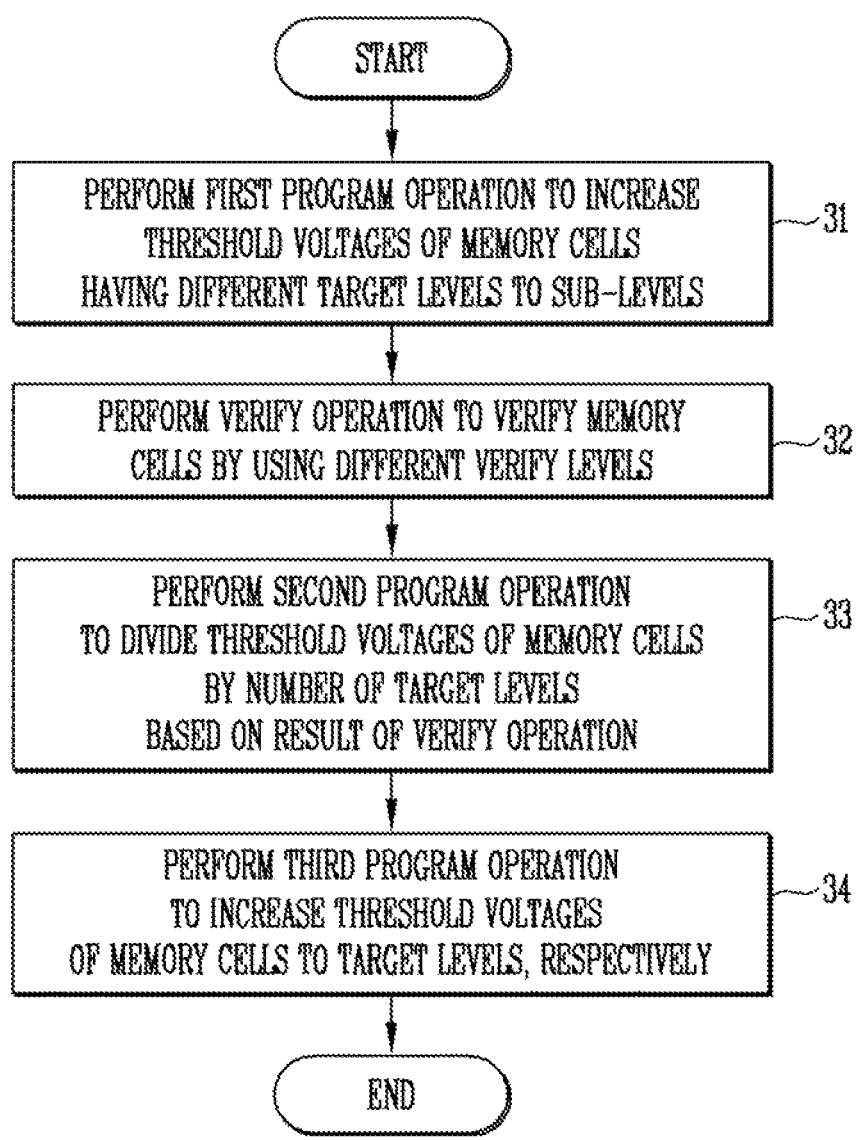
FIG. 3 is a flowchart illustrating a program method according to an embodiment of the present invention.

FIG. 3 is a flowchart illustrating a program method according to an embodiment of the present invention.

Referring to FIG. 3, when a program command is inputted to the control circuit 130, shown in FIG. 1, the control circuit 130 may control the peripheral circuit 120, shown in FIG. 1. Therefore, the peripheral circuit 120 may perform a first program operation so that memory cells may be divided into a predetermined number of cell groups distinguished by threshold voltages thereof, verify the memory cells, perform a second program operation so that the threshold voltages of the memory cells may be divided into a target number of voltage distributions based on a verify result, and perform a third program operation so that the threshold voltages of the memory cells may be greater than target levels, respectively.

The above program operation may include a first program operation 31, a verify operation 32, a second program operation 33 and a third program operation 34. Each of the operations is described below in detail.

1) First Program Operation 31

When the program operation starts, the first program operation may be performed by applying a program pulse to a selected word line to increase threshold voltages of selected memory cells. In a TLC or QLC mode, i.e., when there are many final target levels of threshold voltages, the first program operation may be performed so that memory cells having different target levels may be grouped and threshold voltages of the grouped memory cells may be increased to sub-levels lower than the final target levels at the same time. For example, a plurality of memory cell groups including memory cells having different target levels may be defined, and threshold voltages of the memory cell groups may be increased to different sub-levels. In order to reduce program operating time, the first program operation may be performed on each of the memory cell groups by applying a program pulse to the selected word line. In other words, the first program operation may be performed by sequentially applying different program pulses to selected word lines so that threshold voltage distributions of the memory cells included in different groups may be distinguished from each other. Each of the program pulses may be applied to the selected word line once. In addition, a program permission voltage of, for example, 0V may be applied to bit lines coupled to a selected memory cell group, and a program inhibition voltage of, for example, VCC may be applied to bit lines coupled to the remaining memory cell groups.

2) Verify Operation 32

When the grouped memory cells are verified, the memory cells may be verified using different verify levels determined based on the number of target levels. For example, when there are two target levels of memory cells included in a first memory cell group, two different verify levels may be used. When there are three target levels, three different verify levels may be used.

The verify levels used in the verify operation 32 may be determined by threshold voltage distributions of memory cells to be verified. A verify voltage may be set to be greater than the lowest threshold voltage in the threshold voltage distribution. Therefore, when a verify operation is performed, a result of the verify operation may be determined to be a fail due to memory cells having lower threshold voltages than the verify levels.

3) Second Program Operation 33

Based on the result of the verify operation, the second program operation may be performed so that the threshold voltages of the memory cells may be divided by the number of target levels. The second program operation may be performed on failed memory cells. For example, by applying a program pulse to a selected word line coupled to the failed memory cells, the failed memory cells may be increased at the same time regardless of the target levels. The program pulse may be applied to the selected word line once in order to reduce operating time. Since different verify operations are performed on memory cells, the memory cells have different threshold voltage distributions after being programmed, even using the same program pulse. For example, when a higher verify level is used for second memory cells than for first memory cells, during the verify operation 32, and the second program operation is performed, threshold voltages of the second memory cells may be increased to be greater than those of the first memory cells. Therefore, the memory cells having different target levels may be divided into different threshold voltage distributions.

4) Third Program Operation 34

When the threshold voltage distributions of the memory cells are divided based on the number of target levels, the second program operation may be performed so that the threshold voltages of the memory cells may reach the target levels, respectively. The third program operation may be performed by an Incremental Step Pulse Program (ISPP) scheme.

Various embodiments based on the above-described program method are described below.

Figure 4:
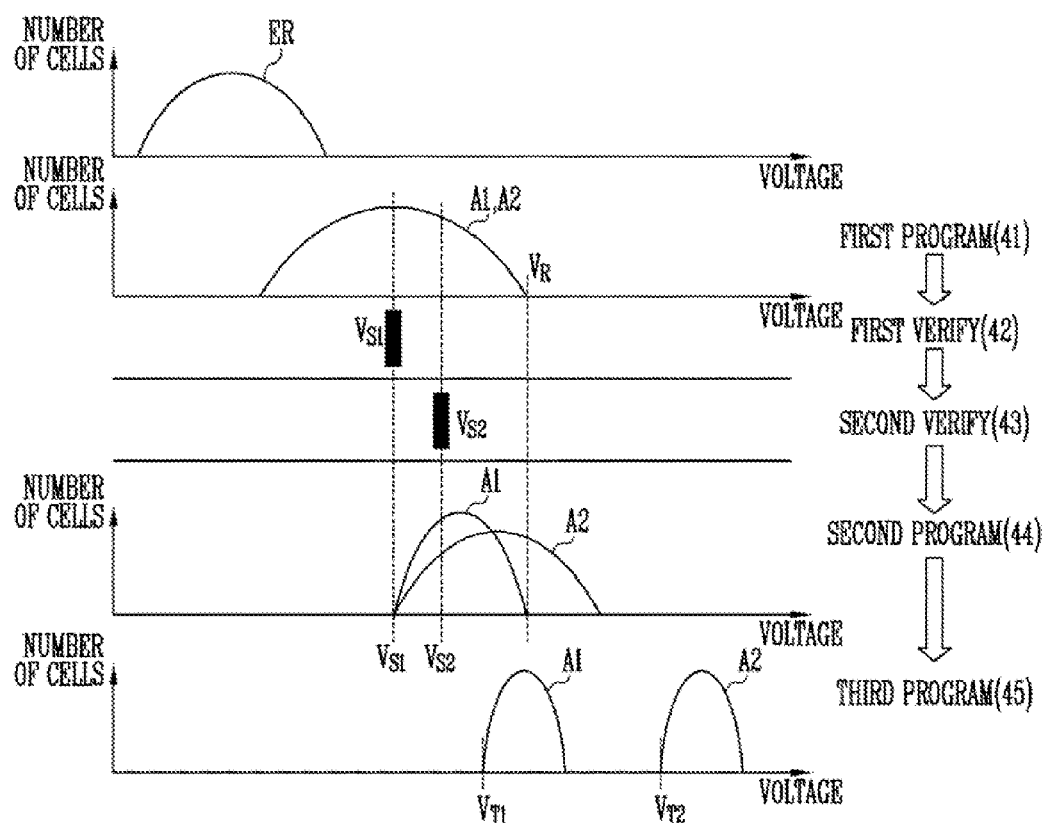
FIG. 4 is a diagram illustrating a program method according to a first embodiment of the present invention.

FIG. 4 is a diagram illustrating a program method according to a first embodiment of the present invention.

Referring to FIG. 4, when a program operation is performed on memory cells having an erase state ER, a first program operation 41 may be performed so that threshold' voltages of first memory cells A1 to be programmed to a first target level $V_{T1}$ and second memory cells A2 to be programmed to a second target level $V_{T2}$ may be increased' at the same time. The first program operation 41 may be performed by applying a program pulse to a selected word line coupled to the first memory cells A1 and the second memory cells A2. In other words, the threshold voltages of the first and second memory cells A1 and A2 may be increased at the same time by applying the program pulse to the selected word line once. Since it is difficult to increase the threshold voltages of the first and second memory cells A1 and A2 to the first and second target level $V_{T1}$ and $V_{T2}$ by performing only the first program operation 41, the following operations may be performed.

A first verify operation 42 using a first verify voltage $V_{S1}$ may be performed in order to verify the threshold voltages of the first memory cells A1 on which the first program operation 41 is performed. For example, the first verify voltage $V_{S1}$ may be set to a voltage corresponding to the center of the threshold voltage distribution of the first memory cells A1 on which the first program operation 41 is performed. Therefore, when the first verify operation 42 is performed the first verify operation 42 may be determined to be a fail by the memory cells having lower threshold voltages than the first verify voltage $V_{S1}$.

When the first verify operation 42 ends, a second verify operation 43 using a second verify voltage $V_{S2}$ may be performed to verify the threshold voltages of the second memory cells A2 on which the first program operation 41 is performed. The second verify voltage $V_{S2}$ may be set to be greater than the first verify voltage $V_{S1}$ and lower than the highest voltage (VR), among the threshold voltages of the second memory cells A2 on which the first program operation 41 is performed. Therefore, when the second verify operation 43 is performed, the second verify operation 43 may be determined to be a fail due to the memory cells having lower threshold voltages than the second verify voltage $V_{S2}$.

When the second verify operation 43 ends, a second program operation 44 may be performed to divide the threshold voltages of the first and second memory cells A1 and A2, which are distributed over the same interval, by the first program operation 41. The second program operation 44 may be performed on the failed memory cells of the first and second verify operations 42 and 43 at the same time. For example, the second program operation 44 may be performed by applying the program pulse to the selected word line once. When the program pulse is applied to the selected word line, threshold voltages of the failed memory cells of the first and second memory cells A1 and A2 may be increased at the same time. However, the threshold voltage distributions of the first and second memory cells A1 and A2 may be different from each other due to the previously performed first and second verify operations 42 and 43. Even when the same program pulse is applied to the selected word line, threshold voltages of memory cells for which a higher verify voltage is used than for other memory cells may be increased more. In other words, even when the same program pulse is used during the subsequent second program operation 44, the difference between the first and second verify voltages $V_{S1}$ and $V_{S2}$ used in the first and second verify operations 42 and 43 may cause a difference in threshold voltage distributions between the first and second memory cells A1 and A2.

When the threshold voltage distributions of the first and second memory cells A1 and A2 are divided by the second program operation 44, the third program operation 45 may be performed so that the threshold voltages of the first and second memory cells A1 and A2 may reach the target levels $V_{T1}$ and $V_{T2}$, respectively. For example, the third program operation may include a program operation performed on the first memory cells A1 and a program operation performed on the second memory cells A2. The program operations may be performed on the first and second memory cells A1 and A2 by an Incremental Step Pulse Program (ISPP) scheme. When the threshold voltages of the first memory cells A1 are greater than the first target level $V_{T1}$, and the threshold voltages of the second memory cells A2 are greater than the second target level $V_{T2}$ by performing the third program operation, the program operation of a page including the first and second memory cells A1 and A2 may be terminated.

Figure 5:
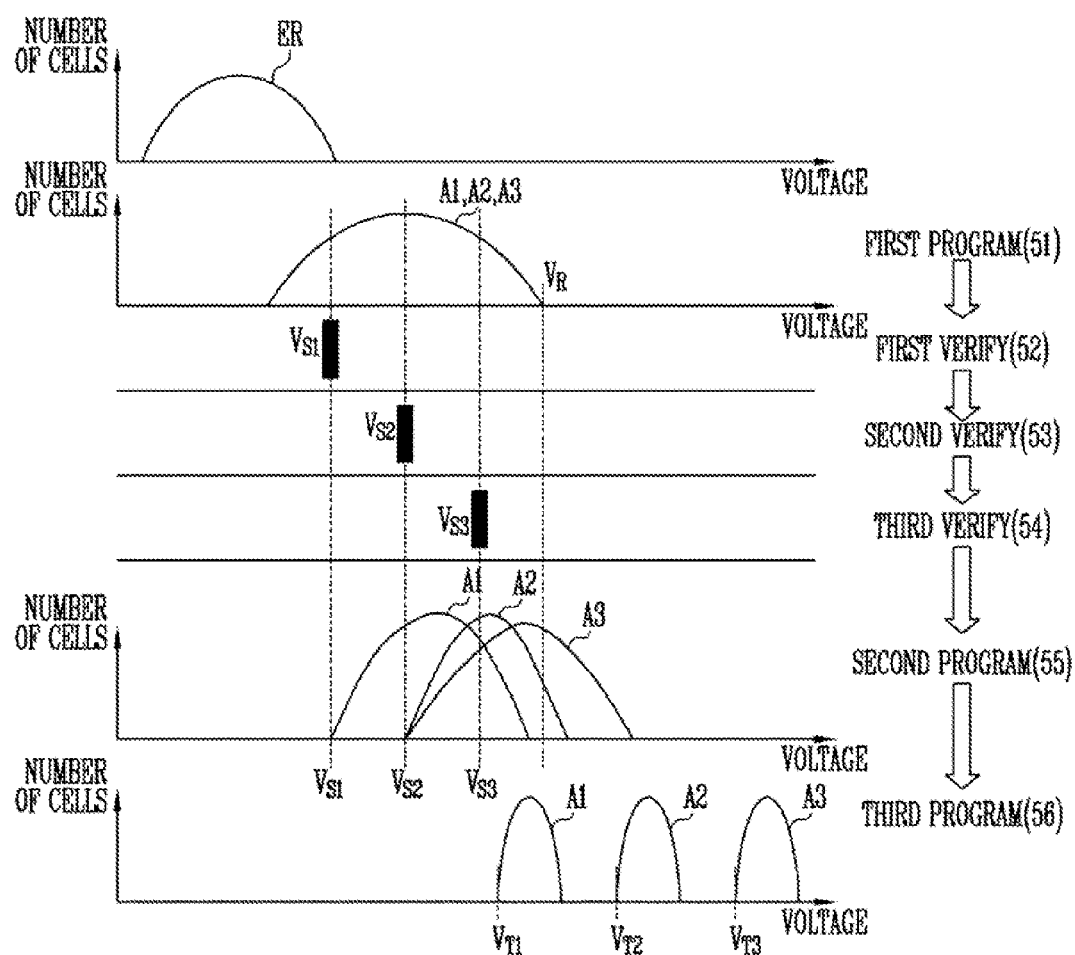
FIG. 5 is a diagram illustrating a program method according to a second embodiment of the present invention.

FIG. 5 is a diagram illustrating a program method according to a second embodiment of the present invention.

Referring to FIG. 5, when a program operation starts to be performed on the memory cells having the erase state ER, a first program operation 51 may be performed to increase threshold voltages of the first memory cells A1 to be programmed to the first target level $V_{T1}$, the second memory cells A2 to be programmed to the second target level $V_{T2}$, and third memory cells A3 to be programmed to a third target level $V_{S3}$ at the same time. The first program operation 51 may be performed by applying a program pulse to a selected word line coupled to the first to third memory cells A1 to A3. For example, the threshold voltages of the first to third memory cells A1 to A3 may be increased at the same time by applying the program pulse to the selected word line once. Since it is difficult to increase the threshold voltages of the first, second and third memory cells A1 A2 and A3 to the first, second and third target level $V_{T1}$, $V_{T2}$ and $V_{T3}$, respectively, by performing only the first program operation 51, the following operations may be performed.

In order to verify threshold voltages of the first memory cells A1, among the first to third memory cells A1 to A3 on which the first program operation 51 is performed, a first verify operation 52 using the first verify voltage $V_{S1}$ may be performed. The first verify voltage $V_{S1}$ may be set to be between a voltage corresponding to the center of the threshold voltage distribution of the first memory cells A1 on which the first program operation 51 is performed and the lowest voltage in the threshold voltage distribution. Therefore, when the first verify operation 52 is performed, the first verify operation 52 may be determined to be a fail due to memory cells having lower threshold voltages than the first verify voltage $V_{S1}$.

When the first verify operation 52 ends, a second verify operation 53 using the second verify voltage. $V_{S2}$ may be performed to verify threshold voltages of the second memory cells A2, among the first to third memory cells A1 to A3 on which the first program operation 51 is performed. The second verify voltage $V_{S2}$ may be set to a voltage corresponding to the center of the threshold voltage distribution of the second memory cells A2 on which the first program operation 51 is performed. Therefore, when the second verify operation 53 is performed, the second verify operation 53 may be determined to be a fail due to memory cells having lower threshold voltages than the second verify voltage $V_{S2}$.

When the second verify operation 53 ends, a third verify operation 54 using a third verify voltage $V_{S3}$ may be performed to verify threshold' voltages of the third memory cells A3, among the first to third memory cells A1 to A3 on which the first program operation 51 is performed. The third verify voltage $V_{S3}$ may be greater than the second verify voltage $V_{S2}$ and lower than the highest voltage (VR), among the threshold voltages of the third memory cells A3 on which the first program operation 51 is performed. Therefore, when the third verify operation 54 is performed, the third verify operation 54 may be determined to be a fail due to memory cells having lower threshold voltages than the third verify voltage $V_{S3}$.

When the third verify operation 54 ends, a second program operation 55 may be performed to divide the threshold voltages of the first to third memory cells A1 to A3 which are distributed over the same interval by the first program operation 51. The second program operation 55 may be performed by applying the program pulse to the selected word line once or twice. For example, by applying a program permission voltage of, for example, 0V to the bit lines coupled to the first to third memory cells A1 to A3 and applying the program pulse to the selected word line once, the threshold voltage distributions of the first to third memory cells A1 to A3 may be divided. However, when the program pulse is used once, the difference in threshold voltage distribution between the first to third memory cells A1 to A3 may not be significant. Therefore, the program pulse may be used twice.

When the program pulse is used twice, by applying a program permission voltage to the bit lines coupled to the first to third memory cells A1 to A3 and applying the program pulse to the selected word line once, the threshold voltage distributions of the first to third memory cells A1 to A3 may be divided. Subsequently, threshold voltage distributions of the second and third memory cells A2 and A3 may be further divided by applying the program inhibition voltage of, for example, VCC to the bit lines coupled to the first memory cells A1, applying the program permission voltage to the bit lines coupled to the second and third memory cells A2 and A3, and applying the program pulse to the selected word line one more time. The program pulse, which is first used in the second program operation 55, may have a lower level than the second program pulse, which is subsequently used. FIG. 5 illustrates the threshold voltage distribution when the program pulse is used twice during the program operation 55.

When the program pulse is applied to the selected word line, the threshold voltages of the failed memory cells of the first to third memory cells A1 to A3 may be increased at the same time. However, the threshold voltage distributions of the first to third memory cells A1 to A3 may be different from each other by the previously performed first to third verify operations 52 to 54. Even when the same program pulse is applied to the selected word line, threshold voltages of memory cells for which a higher verify voltage is used may be greater than those of other memory cells. In other words, even when the same program pulse is used in the subsequent second program operation 55, the difference between the first, second and third verify voltages $V_{S1}$, $V_{S2}$ and $V_{S3}$ used in the first, second and third verify operations 52, 53 and 54, respectively, may lead to the difference in threshold voltage distributions between the first, second and third memory cells A1, A2 and A3.

When the threshold voltage distributions of the first to third memory cells A1 to A3 are divided by the second program operation 55, a third program operation 56 may be performed so that the threshold voltages of the first, second and third memory cells A1, A2 and A3 may reach the target levels $V_{T1}$, $V_{T2}$ and $V_{T3}$ respectively. For example, the third program operation 56 may include a program operation performed on the first memory cells A1, a program operation performed on the second memory cells A2 and a program operation performed on the third memory cells A3. The program operations may be performed on the first to third memory cells A1 to A3 by an Incremental Step Pulse Program (ISPP) scheme. By performing the third program operation 56, the threshold voltages of the first memory cells A1 may be greater than the first target level $V_{T1}$, and the threshold voltages of the second memory cells A2 may be greater than the second target level $V_{T2}$, and the threshold voltages of the third memory cells A3 may be greater than the third target level $V_{T3}$. Accordingly, the program operation on a page including the first to third memory cells A1 to A3 may be terminated.

Figure 6:
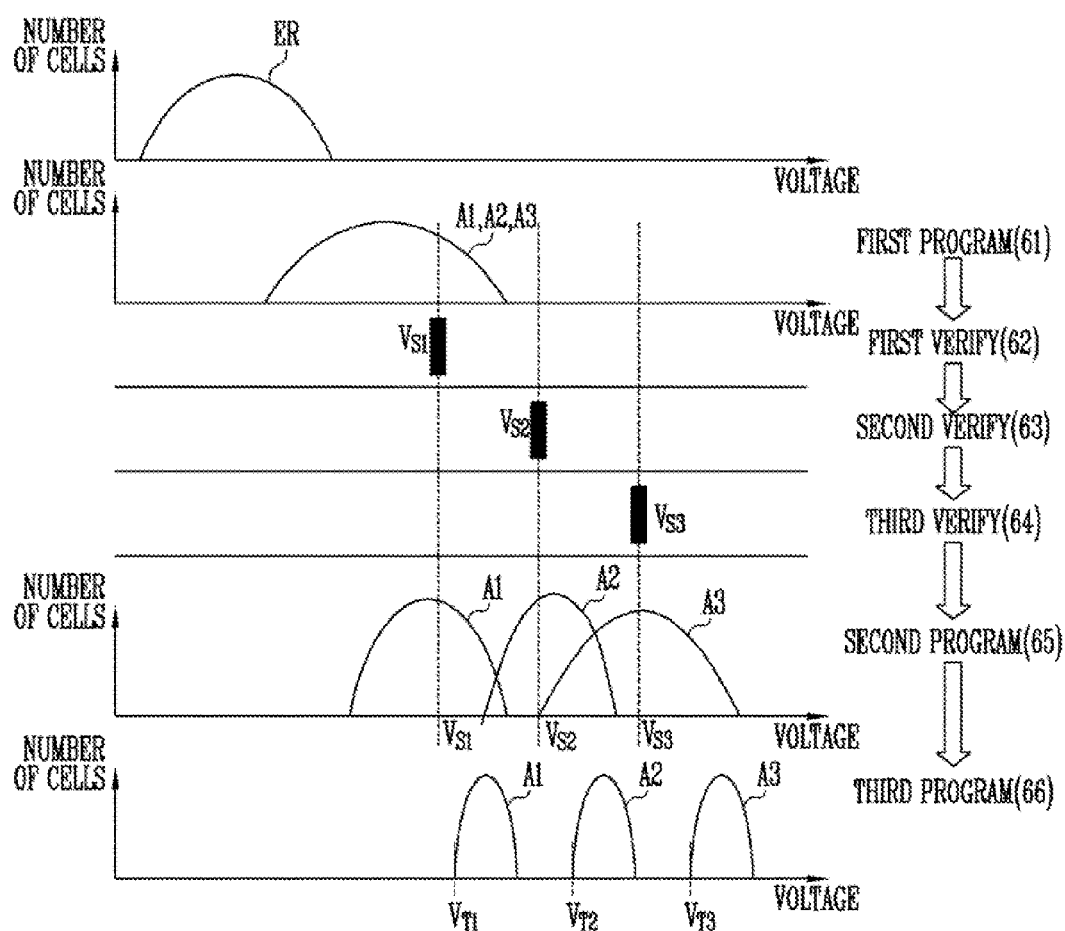
FIG. 6 is a diagram illustrating a program method according to a third embodiment of the present invention.

FIG. 6 is a diagram illustrating a program method according to a third embodiment of the present invention.

Referring to FIG. 6, when a program operation starts to be performed on the memory cells having the erase state ER, a first program operation 61 may be performed so that threshold voltages of the first memory cells A1 to be programmed to the first target level $V_{T1}$, the second memory cells A2 to be programmed to the second target level $V_{T2}$, and the third memory cells A3 to be programmed to the third target level $V_{S3}$ may be increased at the same time. The first program operation 61 may be performed by applying the program pulse to the selected word line coupled to the first to third memory cells A1 to A3. For example, by applying the program pulse to the selected word line once, the threshold voltages of the first to third memory cells A1 to A3 may be increased at the same time. However, since it is difficult to increase the threshold voltages of the first to third memory cells A1 to A3 to the first, second or third target level $V_{T1}$, $V_{T2}$ and $V_{T3}$ by performing only the first program operation 61, the following operations may be performed.

A first verify operation 62 using the first verify voltage $V_{S1}$ may be performed to verify the threshold voltages of the first memory cells A1, among the first to third memory cells A1 to A3 on which the first program operation 61 is performed. The first verify voltage $V_{S1}$ may be set between a voltage corresponding to the center of the threshold voltage distribution of the first memory cells A1 on which the first program operation 61 is performed and the highest voltage in the threshold voltage distribution. Therefore, when the first verify operation 62 is performed, the first verify operation 62 may be determined to be a fail due to memory cells having lower threshold voltages than the first verify voltage $V_{S1}$.

When the first verify operation 62 ends, a second verify operation 63 using the second verify voltage $V_{S2}$ may be performed to verify the threshold voltages of the second memory cells A2, among the first to third memory cells A1 to A3 on which the first program operation 61 is performed. The second verify voltage $V_{S2}$ may be set to a voltage between the second target level $V_{T2}$ and the highest voltage in the threshold voltage distribution of the second memory cells A2 on which the first program operation 61 is performed. Therefore, when the second verify operation 63 is performed, the second verify operation 63 may be determined to be a fail due to memory cells having lower threshold voltages than the verify voltage $V_{S2}$.

When the second verify operation 63 ends, a third verify operation 64 using the third verify voltage $V_{S3}$ may be performed to verify the threshold voltages of the third memory cells A3, among the first to third memory cells A1 to A3 on which the first program operation 61 is performed. The third verify voltage $V_{S3}$ may be set to a voltage between the second verify voltage $V_{S2}$ and the third target level $V_{R3}$. Therefore, the third verify operation 64 may be determined to be a fail due to memory cells having lower threshold voltages than the third verify voltage $V_{S3}$.

When the third verify operation 64 ends, a second program operation 65 may be performed to divide the threshold voltages of the first to third memory cells A1 to A3 distributed over the same interval by the first program operation 61. The second program operation 65 may be performed by applying the program pulse to the selected word line three times. For example, the threshold voltage distribution of the first to third memory cells A1 to A3 may be divided into different distributions by applying the program permission voltage to the bit lines coupled to the first to third memory cells A1 to A3 and applying the first program pulse to the selected word line. Subsequently, the threshold voltage distribution of the first memory cells A1 and the threshold voltage distribution of the second and third memory cells AZ and A3 may be divided by applying the program inhibition voltage of, for example, VCC to the bit lines coupled to the first memory cells A1 applying the program permission voltage to the bit lines coupled to the second and third memory cells A2 and A3, and applying the second program pulse to the selected word line. Subsequently, by applying the program inhibition voltage to the bit lines coupled to the first and second memory cells A1 and A2, applying the program permission voltage to the bit lines coupled to the third memory cells A3 and applying the third program pulse to the selected word line, the threshold voltage distribution of the first and second memory cells A1 and A2 and the threshold voltage distribution of the third memory cells A3 may be divided. The second program pulse may have a greater level than the first program pulse. The third program pulse may have a greater level than the second program pulse.

When the program pulse is applied to the selected word line, the threshold voltages of the failed memory cells of the first to third memory cells A1 to A3 may be increased at the same time. The threshold voltage distributions of the first to third memory cells A1 to A3 may be different from each other by the previously performed first to third verify operations 62 to 64. Even when the same program pulse is applied to the selected word line, threshold voltages of memory cells for which a higher verify voltage is used may be greater than those of other memory cells. In other words, even when the same program pulse is used during the second program operation 65, the difference between the first, second and third verify voltages $V_{S1}$, $V_{S2}$ and $V_{S3}$ used in the first, second and third verify operations 62, 63 and 64 may lead to the difference in threshold voltage distributions between the first, second and third memory cells A1, A2 and A3.

When the first to third memory cells A1 to A3 are divided into different threshold voltage distributions by the second program operation 65, the third program operation 66 may be performed so that the threshold voltages of the first, second and third memory cells A1 A2 and A3 may reach the target levels ($V_{T1}$, $V_{T2}$ and $V_{T3}$), respectively. For example, the third program operation 66 may include a program operation performed on the first memory cells A1, a program operation performed on the second memory cells A2 and a program operation performed on the third memory cells A3. The program operations may be performed on the first to third memory cells A1 to A3 by an Incremental Step Pulse Program (ISPP) scheme. By performing the third program operation 66, the threshold voltages of the first memory cells A1 may be greater than the first target level $V_{T1}$, and the threshold voltages of the second memory cells A2 may be greater than the second target level $V_{T2}$, and the threshold voltages of the third memory cells A3 may be greater than the third target level $V_{T3}$. Accordingly, the program operation on a page including the first to third memory cells A1 to A3 may be terminated.

Figure 7:
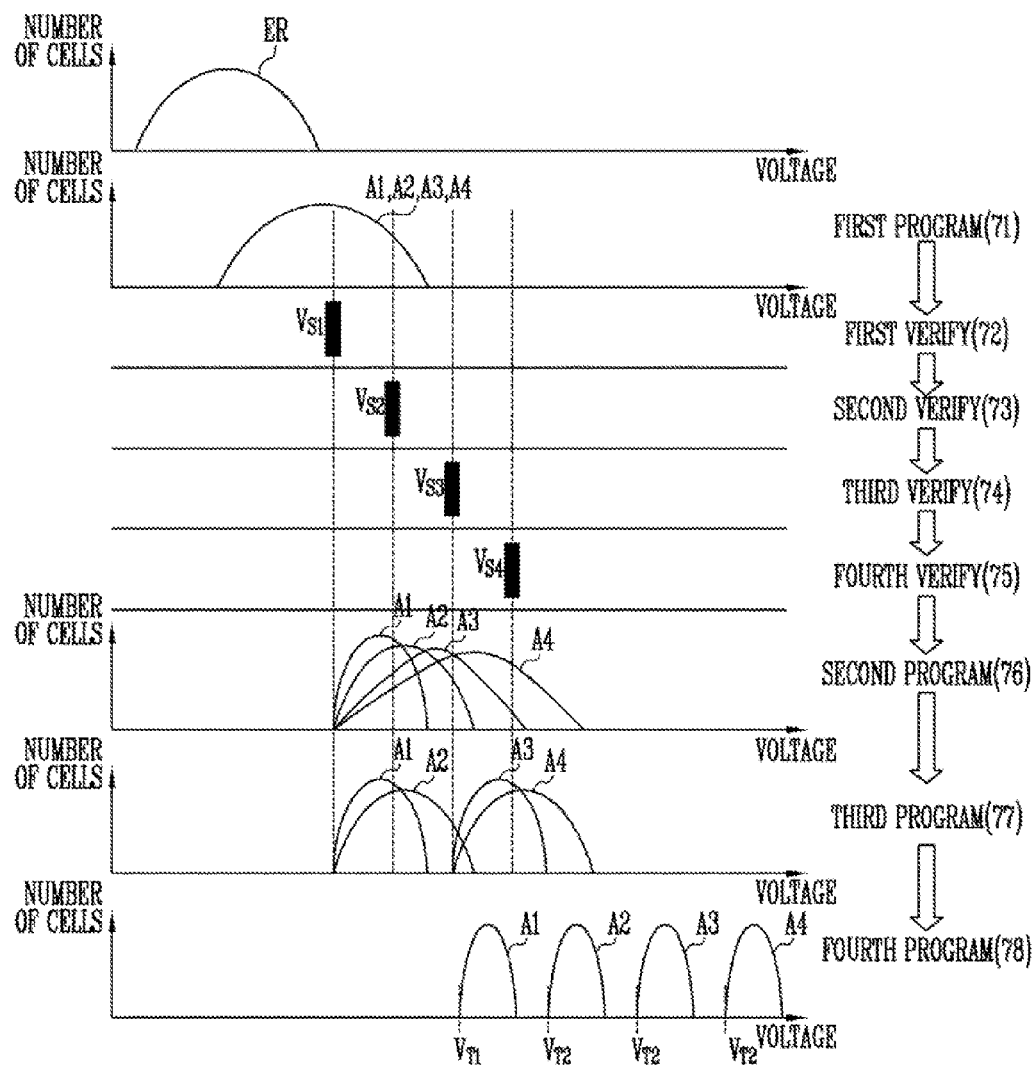
FIG. 7 is a diagram illustrating a program method according to a fourth embodiment of the present invention.

FIG. 7 is a diagram illustrating a program method according to a fourth embodiment of the present invention.

Referring to FIG. 7, when a program operation starts to be performed on the memory cells having the erase state ER, a first program operation 71 may be performed to increase the threshold voltages of first to fourth memory cells A1 to A4 at the same time. The first memory cells A1 may be programmed so that the threshold voltages thereof may increase to the first target level $V_{T1}$. The second memory cells A2 may be programmed so that the threshold voltages thereof may increase to the second target level $V_{T2}$, greater than the first target level $V_{T1}$. The third memory cells A3 may be programmed so that the threshold voltages thereof may increase to the third target level $V_{T3}$, greater than the second target level $V_{T2}$. The fourth memory cells A4 may be programmed so that the threshold voltages thereof may increase to a fourth target level $V_{T4}$, greater than the third target level $V_{T3}$.

The first program operation 71 may be performed by applying a program pulse to a selected word line coupled to the first to fourth memory cells A1 to A4. In other words, by applying the program pulse to the selected word line once, the threshold voltages of the first to fourth memory cells A1 to A4 may be increased at the same time. However, since it is difficult to sufficiently increase the threshold voltages of the first to fourth memory cells A1 to A4 by performing only the first program operation 71, the following operations may be performed.

A first verify operation 72 using the first verify voltage $V_{S1}$ may be performed to verify the threshold voltages of the first memory cells A1, among the first to fourth memory cells A1 to A4 on which the first program operation 71 is performed. The first verify voltage. $V_{S1}$ may be set to the center of the threshold voltage distribution of the first memory cells A1 on which the first program operation 71 is performed. Therefore, when the first verify operation 72 is performed, the first verify operation 72 may be determined to be a fail since memory cells having lower threshold voltages than the first verify voltage $V_{S1}$ are always present.

When the first verify operation 72 ends, a second verify operation 73 using the second verify voltage $V_{S2}$ may be performed to verify the threshold voltages of the second memory cells A2, among the first to fourth memory cells A1 to A4 on which the first program operation 71 is performed. The second verify voltage $V_{S2}$ may be set to a voltage between the first verify voltage $V_{S1}$ and the highest voltage in the threshold voltage distribution of the second memory cells A2 on which the first program operation 71 is performed. Therefore, the second verify operation 73 may be always determined to be a fail due to memory cells having lower threshold voltages than the second verify voltage $V_{S2}$.

When the second verify operation 73 ends, a third verify operation 74 using the third verify voltage $V_{S3}$ may be performed to verify the threshold voltages of the third memory cells A3, among the first to fourth memory cells A1 to A4 on which the first program operation 71 is performed. The third verify voltage $V_{S3}$ may be set to a voltage between the second verify voltage $V_{S2}$ and the third target level $V_{T3}$. Therefore, the third verify operation 74 may be always determined to be a fail due to memory cells having lower threshold voltages than the third verify voltage $V_{S3}$.

When the third verify operation 74 ends, a fourth verify operation 75 using a fourth verify voltage $V_{S4}$ may be performed to verify the threshold voltages of the fourth memory cells A4, among the first to fourth memory cells A1 to A4 on which the first program operation 71 is performed. The fourth verify voltage $V_{S4}$ may be set to a voltage between the third verify voltage $V_{S3}$ and the fourth target level $V_{T4}$. Therefore, the fourth verify operation 75 may always be determined to be a fail due to memory cells having lower threshold voltages than the fourth verify voltage $V_{S4}$.

When the fourth verify operation 75 ends, a second program operation 76 may be performed to divide the threshold voltages of the first to fourth memory cells A1 to A4 distributed over the same interval by the first program operation 71. The second program operation 76 may be performed on the failed memory cells of the first to fourth memory cells A1 to A4 at the same time. For example, the second program operation 76 may be performed by applying, the program pulse to the selected word line once. When the program pulse is applied to the selected word line, the threshold voltages of the failed memory cells of the first to fourth memory cells A1 to A4 may be increased at the same time. The threshold voltage distributions of the first to fourth memory cells A1 to A4 may be different from each other by the previously performed first to fourth verify operations 72 to 75. Even when the same program pulse is applied to the selected word line, threshold voltages of memory cells for which a higher verify voltage is used may be greater than threshold voltages of other memory cells. In other words, even when the same program pulse is used during the second program operation 76 the difference in the first to fourth verify voltages $V_{S1}$ to $V_{S4}$ used in the first to fourth verify operations 72 to 75 may lead to the difference in threshold voltage distributions between the first to fourth memory cells A1 to A4.

After the second program operation 76 ends, a third program operation 77 may be performed to further increase the threshold voltage distribution of the third and fourth memory cells A3 and A4. During the third program operation 77, the first and second memory cells A1 and A2 may not be selected, and the third and fourth memory cells A3 and A4 may be selected. For example, the threshold voltages of the third and fourth memory cells A3 and A4 may be increased by applying the program inhibition voltage to the bit lines coupled to the first and second memory cells A1 and A2, applying the program permission voltage to the bit lines coupled to the third and fourth memory cells A3 and A4, and applying the program pulse to the selected word line. The third program operation 77 may be performed by applying a program pulse having a greater level than the second program operation 76 to the selected word line once.

When the first to fourth memory cells A1 to A4 are divided into different threshold voltage distributions by the third program operation 77, a fourth program operation 78 may be performed so that the threshold voltages of the first to fourth memory cells A1 to A4 may reach the target levels $V_{T1}$ to $V_{T4}$, respectively. For example, the fourth program operation 78 may be performed by an Incremental Step Pulse Program (ISPP) scheme. When the threshold voltages of the first to fourth memory cells A1 to A4 are greater than the first to fourth target levels $V_{T1}$ to $V_{T4}$ by performing the fourth program operation 78, the program operation on a page including the first to fourth memory cells A1 to A4 may be terminated.

Various program methods to which the above-described embodiments in FIGS. 4 to 7 are applied are described below.

Figure 8:
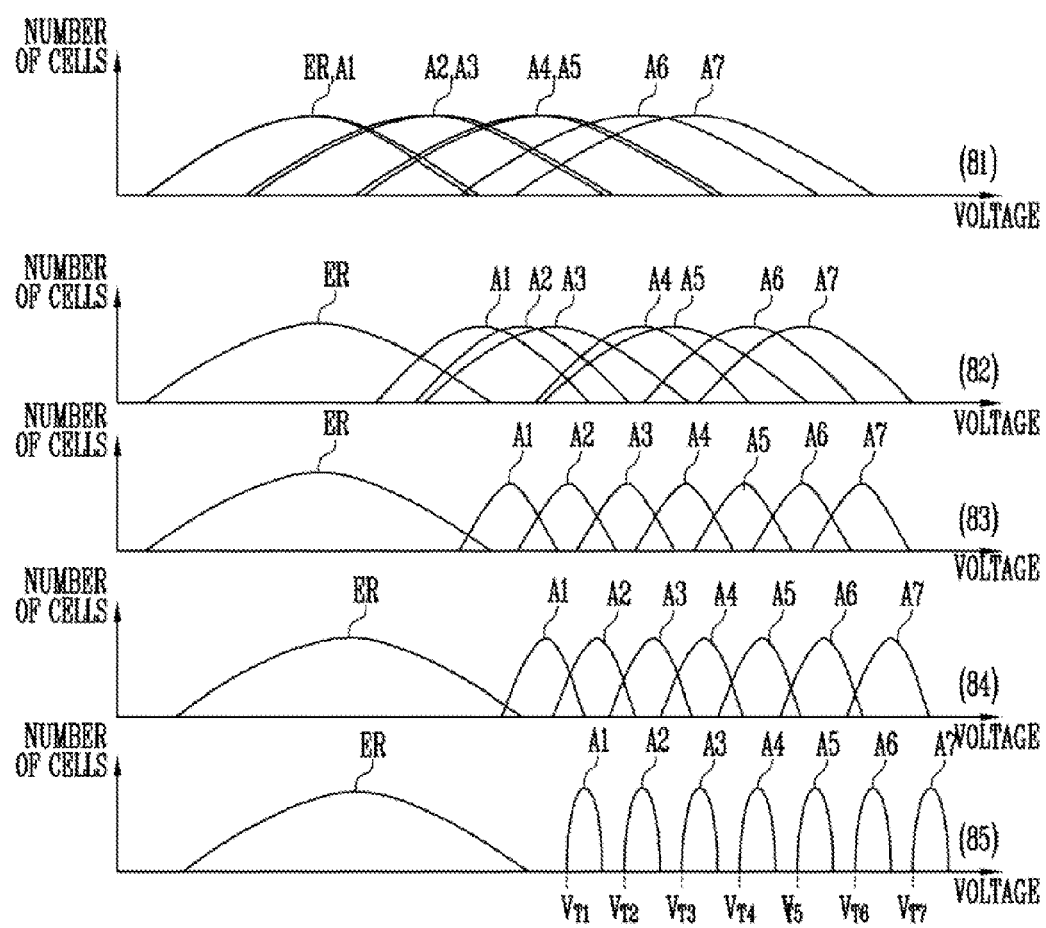
FIG. 8 is a diagram illustrating a triple level cell mode according to a first embodiment of the present invention.

FIG. 8 is a diagram illustrating a triple level cell mode according to a first embodiment of the present invention.

Referring to FIG. 8, a first program operation 81 may be performed so that among the first to seventh memory cells A1 to A7 having the erase state ER, threshold voltages of the second and third memory cells A2 and A3 may be increased at the same time, and the threshold voltages of the fourth and fifth memory cells A4 and A5 may be increased at the same time, and the threshold voltages of the sixth memory cells A6 may be increased at the same time, and the threshold voltages of the seventh memory cells A7 may be increased. The first program operation 81 is described below in detail.

When a command is applied to the control circuit to perform a program operation on a selected memory block, the control circuit may control the peripheral circuit to perform an erase operation on the selected memory block first. After the erase operation is completed, only the memory cells having the erase state ER may exist in the selected memory block. Among the memory cells having the erase state ER, memory cells having different target levels may be defined as the first memory cells A1, the second memory cells A2, the third memory cells A3, the fourth memory cells A4, the fifth memory cells A5, the sixth memory cells A6 and the seventh memory cells A7. The first memory cells A1 may be program target cells having the first target level $V_{T1}$. The second memory cells A2 may be program target cells having the second target level $V_{T2}$, higher than the first target level $V_{T1}$. The third memory cells A3 may be program target cells having the third target level $V_{T3}$, greater than the second target level $V_{T2}$. The fourth memory cells A4 may be program target cells having the fourth target level $V_{T4}$, greater than the third target level $V_{T3}$. The fifth memory cells A5 may be program target cells having a fifth target level $V_{T5}$, greater than the fourth target level $V_{T4}$. The sixth memory cells A6 may be program target cells having a sixth target level $V_{T6}$, greater than the fifth target level $V_{T5}$. The seventh memory cells A7 may be program target cells having a seventh target level $V_{T7}$, greater than the sixth target level $V_{T6}$. The first program operation 81 may be performed as follows.

When a program permission voltage is applied to the bit lines coupled to the second and third memory cells A2 and A3 and a program inhibition voltage is applied to the remaining bit lines, a first program pulse may be applied to a selected word line to increase the threshold voltages of the second and third memory cells A2 and A3. Subsequently, when the program permission voltage is applied to the bit lines coupled to the fourth and fifth memory cells A4 and A5 and the program inhibition voltage is applied to the remaining bit lines, a second program pulse having a higher level than the first program pulse may be applied to the selected word line to increase the threshold voltages of the fourth and fifth memory cells A4 and A5. Subsequently, when the program permission voltage is applied to the bit lines coupled to the sixth memory cells A6 and the program inhibition voltage is applied to the remaining bit lines, a third program pulse having a higher level than the second program pulse may be applied to the selected word line to increase the threshold voltages of the sixth memory cells A6. Subsequently, when the program permission voltage is applied to the bit lines coupled to the seventh memory cells A7 and the program inhibition voltage is applied to the remaining bit lines, a fourth program pulse having a higher level than the third program pulse may be applied to the selected word line to increase the threshold voltages of the seventh memory cells A7. When the first to fourth program pulses are applied to the selected word line, each of the first to fourth program pulses may be applied to the selected word line once in order to reduce program operating time.

By applying the program pulse to the selected word line four times during the above-described first program operation 81, the threshold voltages of the memory cells included in the selected memory block may be divided into five threshold voltage distributions, i.e., a threshold voltage distribution of the erase state ER and the first memory cells A1, a threshold voltage distribution of the second and third memory cells A2 and A3, a threshold voltage distribution of the fourth and fifth memory cells A4 and A5, a threshold voltage distribution of the sixth memory cells A6, and a threshold voltage distribution of the seventh memory cells A7.

When the first program operation 81 is completed, a verify operation using different verify voltages may be performed on the first to seventh memory cells A1 to A7 as described above with reference to FI s. 4 to 7. When the verify operation is completed, a second program operation 82 may be performed to divide the five threshold voltage distributions into eight voltage distributions corresponding to the number of final threshold voltages.

The second program operation 82 may be performed as follows.

When the program permission voltage is applied to the bit lines coupled to the first memory cells A1 and the program inhibition voltage is applied to the remaining bit lines, a fifth program pulse may be applied to the selected word line to increase the threshold voltages of the first memory cells A1 to be greater than the erase state ER. Subsequently, when the program permission voltage is applied to the bit lines coupled to the second and third memory cells A2 and A3 and the program inhibition voltage is applied to the remaining bit lines, a sixth program pulse having a higher level than the fifth program pulse may be applied to the selected word line to increase the threshold voltages of the second and third memory cells AZ and A3. Although the second and third memory cells A2 and A3 are simultaneously programmed by the sixth program pulse, the threshold voltage distribution of the third memory cells A3 may be greater than the threshold voltage distribution of the second memory cells A2 by the previously performed verify operation. Subsequently, when the program permission voltage is applied to the bit lines coupled to the fourth and fifth memory cells A4 and A5 and the program inhibition voltage is applied to the remaining bit lines, a seventh program pulse having a higher level than the sixth program pulse may be applied to the selected word line to increase the threshold voltages of the fourth and fifth memory cells A4 and A5. Although the fourth and fifth memory cells A4 and A5 are simultaneously programmed by the seventh program pulse, the threshold voltage distribution of the fifth memory cells A5 may be higher than the threshold voltage distribution of the fourth memory cells A4 by the previously performed verify operation. Subsequently, when the program permission voltage is applied to the bit lines coupled to the sixth memory cells A6 and the program inhibition voltage is applied to the remaining bit lines, an eighth program pulse having, a higher level than the seventh program pulse may be applied to the selected word line to increase the threshold voltages of the sixth memory cells A6. Subsequently, when the program permission voltage is applied to the bit lines coupled to the seventh memory cells A7 and the program inhibition voltage is applied to the remaining bit lines, a ninth program pulse having a higher level than the eighth program pulse may be applied to the selected word line to increase the threshold voltages of the seventh memory cells A7.

As the second program operation 82 is described above, by applying the program pulse to the selected word line five times, the threshold voltages of the memory cells included in the selected memory block may be divided into eight threshold voltage distributions, i.e., a threshold voltage distribution of the erase state ER, a threshold voltage distribution of the first memory cells A1, a threshold voltage distribution of the second memory cells A2, a threshold voltage distribution of a third memory cells A3, a threshold voltage distribution of the fourth memory cells A4, a threshold voltage distribution of the fifth memory cells A5, a threshold voltage distribution of the sixth memory cells A6, and a threshold voltage distribution of the seventh memory cells A7.

When there are eight threshold voltage distributions after the second program operation 82 is terminated, program operations (83 to 85) may be performed by an Incremental Step Pulse (ISPP) scheme until the threshold voltages of the first to seventh memory cells A1 to A7 reach the first to seventh target levels $V_{T1}$ to $V_{T7}$ respectively.

Since the number of program pulses used is reduced by performing the program operation using the TLC mode, the program operating time may be reduced.

Figure 9:
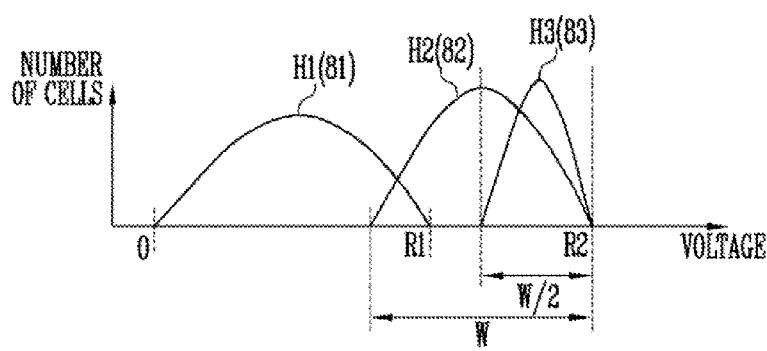
FIG. 9 is a diagram illustrating a method of setting a program pulse and a verify voltage.

FIG. 9 is a diagram illustrating a method of setting a program pulse and a verify voltage used in the program operation shown in FIG. 8.

A method of setting a program pulse when threshold voltages of memory cells are increased and a method of setting a program pulse and a verify voltage when a width of a threshold voltage distribution is reduced are described below with reference to FIG. 9.

1) A Method of Setting a Program Pulse when Threshold Voltages are Increased

A start program pulse applied to increase threshold voltages of memory cells having an erase state first may have a predetermined level. In other words, for the start program pulse, the predetermined level of the semiconductor memory device may be used. The level of the start program pulse may be defined as 'VB1' (in volts). In FIG. 9, reference character H1 denotes a threshold voltage distribution of the memory cells to which the start program pulse VB1 is applied. That is, after the first program operation 81 shown in FIG. 8 is performed on the memory cells having the erase state, the memory cells may have a threshold voltage distribution H1. For example, the first to fourth program pulses may be used in the first program operation 81 shown in FIG. 8. Each of the first to fourth program pulses may have a predetermined level. For a simple explanation, the threshold voltage distribution denoted H1 is referred to as a first threshold voltage distribution H1, and the lowest voltage level in the first threshold voltage distribution H1 is defined as 0V, and the highest voltage level may be defined as 'R1' in volts). Therefore, a width of the first threshold voltage distribution H1 may be 'R1'.

After the first program pulse is applied to the memory cells to have the first threshold voltage distribution H1, a level VB2 of the second program pulse may be set according to Equation 1.

$$VB2=VB1+(R2-R1) \qquad \text{[Equation 1]}$$

Referring to Equation 1, 'VB2' may be a level (in volts) of the next program pulse, and 'R2' may refer to a voltage (in volts) expected to be the highest, among the threshold voltages of the memory cells programmed by the next program pulse. In other words, 'R2' may be a predetermined value of the semiconductor memory device, and the level VB2 of the next program pulse may be calculated by using the level VB1 of the first program pulse, 'R1' and 'R2' based on Equation 1.

When the memory cells are programmed using the second program pulse whose level is determined by Equation 1, the threshold voltages of the memory cells may be increased to have a threshold voltage distribution H2 as shown in FIG. 9. FIG. 9, the threshold voltage distribution H2 may be defined as a second threshold voltage distribution H2, and the second threshold voltage distribution H2 may correspond to a threshold voltage distribution formed by the second program operation 82 in FIG. 8. For example, 'R2' and 'R1' corresponding to the first to seventh memory cells and the level VB1 of the first program pulse may be used to calculate fifth to ninth program pulses, and the second program operation 82 may be performed by using the calculated fifth to ninth program pulses.

2) A Method of Setting a Program Pulse and a Verify Voltage when a Width of Threshold Voltage Distribution is Reduced When the memory cells have the second threshold voltage distribution H2 by the second program pulse, a program operation may be performed to reduce a width of the second threshold voltage distribution H2, which may correspond to the third program operation 83 shown in FIG. 8. The width of the second threshold voltage distribution H2 may be reduced by a program method using the ISPP scheme. The program method using the ISPP scheme may include increasing the threshold voltages of the memory cells by applying the program pulse to the selected word line and verifying the memory cells. A level VB3 of the program pulse may be set according to Equation 2 when the threshold voltages of the memory cells are increased, $$VB3 = VB2 + \frac{W}{2} \qquad \text{[Equation 2]}$$

Referring to Equation 2, 'W' may refer to the width (in volts) of the second threshold voltage distribution H2. In the program operation using the ISPP scheme, a level VB3 of the program pulse may be calculated by using the level VB2 of the previous program pulse and the width W of the threshold voltage distribution. After the threshold voltages of the memory cells are increased by using the calculated program pulse, the memory cells may be verified.

When the memory cells are verified, a verify voltage Vf may be set according to Equation 3.

$$Vf = R2 - \frac{W}{2} \quad \text{[Equation 3]}$$

Referring to Equation 3, the verify voltage Vf may be calculated using the highest voltage R2 in the second threshold voltage distribution H2 and the width W of the second threshold voltage distribution H2. In order to reduce the width W of the second threshold voltage distribution H2 by half, memory cells having lower threshold voltages than a value at the center of the second threshold voltage distribution H2, which is used as a reference, may be programmed by using a subsequent program pulse. Thus, a width of the threshold voltage distribution H3 may be reduced.

Figure 10:
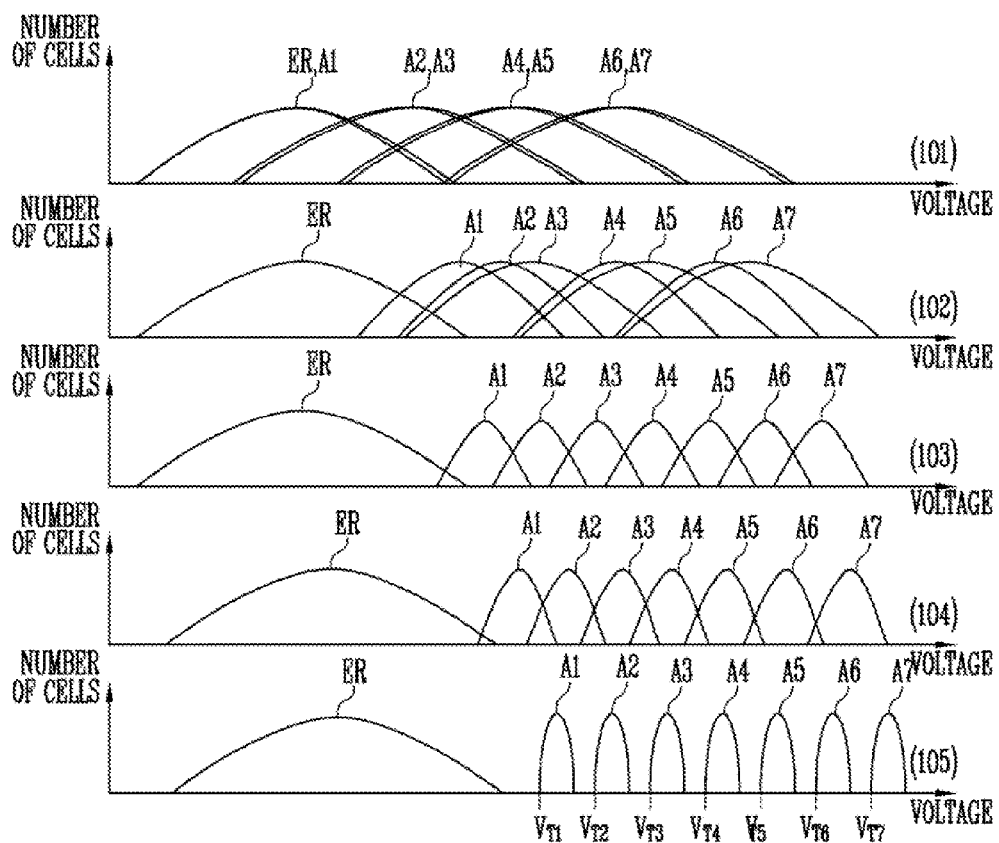
FIG. 10 is a diagram illustrating a triple level cell mode according to a second embodiment of the present invention.

FIG. 10 is a diagram illustrating a triple level cell mode according to a second embodiment of the present invention.

Figure 13:
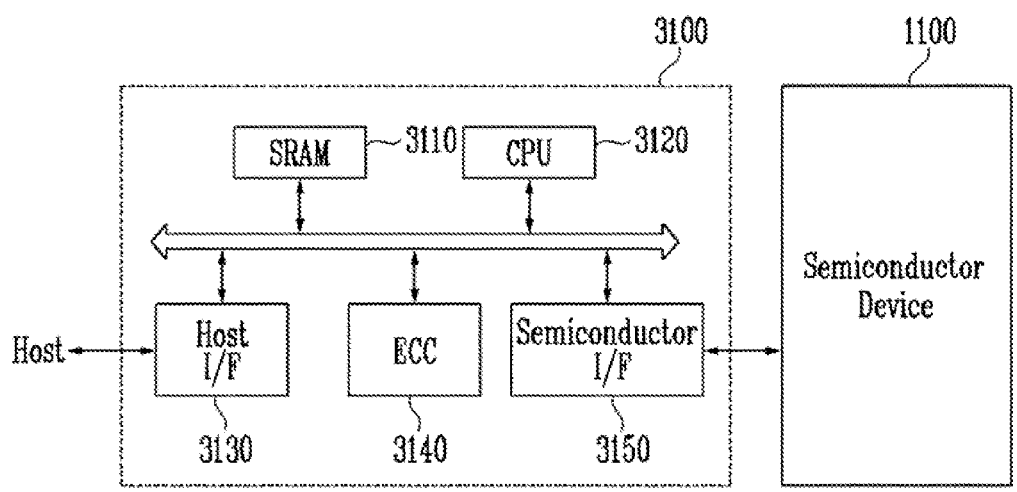
FIG. 13 is a block diagram illustrating a memory system including a semiconductor memory device according to an embodiment of the present invention.

Referring to FIG. 13, a first program operation 101 may be performed so that among the first to seventh memory cells A1 to A7 having the erase state ER, the threshold voltages of the second and third memory cells A2 and A3 may be increased at the same time, and the threshold voltages of the fourth and fifth memory cells A4 and A5 may be increased at the same time, and the threshold voltages of the sixth and seventh memory cells A6 and A7 may be increased. The first program operation 101 is described as follows.

When a command is applied to the control circuit to perform a program operation on a selected memory block, the control circuit may control the peripheral circuit to perform an erase operation on the selected memory block first. After the erase operation is completed, only the memory cells having the erase state ER may exist in the selected memory block. Among the memory cells having the erase state ER, memory cells having different target levels may be defined as the first memory cells A1, the second memory cells A2, the third memory cells A3, the fourth memory cells A4, the fifth memory cells A5, the sixth memory cells A6 and the seventh memory cells A7. The first memory cells A1 may be program target cells having the first target level $V_{T1}$. The second memory cells A2 may be program target cells having the second target level, $V_{T2}$ higher than the first target level $V_{T1}$. The third memory cells A3 may be program target cells having the third target level $V_{T3}$, greater than the second target level $V_{T2}$. The fourth memory cells A4 may be program target cells having the fourth target level $V_{T4}$, greater than the third target level $V_{T3}$. The fifth memory cells A5 may be program target cells having the fifth target level $V_{T5}$ greater than the fourth target level $V_{T4}$. The sixth memory cells A6 may be program target cells having the sixth target level $V_{T6}$, greater than the fifth target level $V_{T5}$. The seventh memory cells A7 may be program target cells having the seventh target level $V_{T7}$, greater than the sixth target level $V_{T6}$.

The first program operation 101 may be performed as follows.

When a program permission voltage is applied to the bit lines coupled to the second and third memory cells A2 and A3 and a program inhibition voltage is applied to the remaining bit lines, a first program pulse may be applied to a selected word line to increase the threshold voltages of the second and third memory cells A2 and A3. Subsequently, when the program permission voltage is applied to the bit lines coupled to the fourth and fifth memory cells A4 and A5 and the program inhibition voltage is applied to the remaining bit lines, a second program pulse having a higher level than the first program pulse may be applied to the selected word line to increase the threshold voltages of the fourth and fifth memory cells A4 and A5. Subsequently, when the program permission voltage is applied to the bit lines coupled to the sixth and seventh memory cells A6 and A7 and the program inhibition voltage is applied to the remaining bit lines, a third program pulse having a higher level than the second program pulse may be applied to the selected word line to increase the threshold voltages of the sixth and seventh memory cells A6 and A7. When the first to third program pulses are applied to the selected word line, each of the first to third program pulses may be applied to the selected word line once in order to reduce program operating time.

By applying the program pulse to the selected word line three times during the above-described first program operation 101, the threshold voltages of the memory cells included in the selected memory block may be divided into four threshold voltage distributions, i.e., a threshold voltage distribution of the erase state ER and the first memory cells A1, a threshold voltage distribution of the second and third memory cells A2 and A3, a threshold voltage distribution of the fourth and fifth memory cells A4 and A5, and a threshold voltage distribution of the sixth memory and seventh cells A6 and A7.

When the first program operation 101 is completed, a verify operation using different verify voltages may be performed on the first to seventh memory cells A1 to A7 as described above with reference to FIGS. 4 to 7. When the verify operation is completed, a second program operation 102 may be performed to divide the four threshold voltage distributions into eight voltage distributions corresponding to the number of final threshold voltages.

The second program operation 102 may be performed as follows.

When the program permission voltage is applied to the bit lines coupled to the first memory cells A1 and the program inhibition voltage is applied to the remaining bit lines, a fourth program pulse may be applied to the selected word line to increase the threshold voltages of the first memory cells A1 to be greater than the erase state ER. Subsequently, when the program permission voltage is applied to the bit lines coupled to the second and third memory cells A2 and A3 and the program inhibition voltage is applied to the remaining bit lines, a fifth program pulse having a higher level than the fourth program pulse may be applied to the selected word line to increase the threshold voltages of the second and third memory cells A2 and A3. Although the second and third memory cells A2 and A3 are simultaneously programmed by the fifth program pulse, the threshold voltage distribution of the third memory cells A3 may be higher than the threshold voltage distribution of the second memory cells A2 by the previously performed verify operation. Subsequently, when the program permission voltage is applied to the bit lines coupled to the fourth and fifth memory cells A4 and A5 and the program inhibition voltage is applied to the remaining bit lines, a sixth program pulse having a higher level than the fifth program pulse may be applied to the selected word line to increase the threshold voltages of the fourth and fifth memory cells A4 and A5. Although the fourth and fifth memory cells A4 and A5 are simultaneously programmed by the sixth program pulse, the threshold voltage distribution of the fifth memory cells A5 may be higher than the threshold voltage distribution of the fourth memory cells A4 by the previously performed verify operation. Subsequently, when the program permission voltage is applied to the bit lines coupled to the sixth and seventh memory cells A6 and A7 and the program inhibition voltage is applied to the remaining bit lines, a seventh program pulse having a higher level than the sixth program pulse may be applied to the selected word line to increase the threshold voltages of the sixth and seventh memory cells A6 and A7. Although the sixth and seventh memory cells A6 and A7 are simultaneously programmed by the seventh program pulse, the threshold voltage distribution of the seventh memory cells A7 may be higher than the threshold voltage distribution of the sixth memory cells A6 by the previously performed verify operation.

As the second program operation 102 described above, by applying the program pulse to the selected word line four times, the threshold voltages of the memory cells included in the selected memory block may be divided into eight threshold voltage distributions, i.e., a threshold voltage distribution of the erase state ER, a threshold voltage distribution of the first memory cells A1, a threshold voltage distribution of the second memory cells A2, a threshold voltage distribution of the third memory cells A3, a threshold voltage distribution of the fourth memory cells A4, a threshold voltage distribution of the fifth memory cells A5, a threshold voltage distribution of the sixth memory cells A6, and a threshold voltage distribution of the seventh memory cells A7.

When there are eight threshold voltage distributions after the second program operation 102 is terminated, program operations (103 to 105) may be performed by an Incremental Step Pulse (ISPP) scheme until the threshold voltages of the first to seventh memory cells A1 to A7 reach the first to seventh target levels $V_{T1}$ to $V_{T7}$ respectively.

As described above, since the number of program pulses used is reduced by performing the program operation using the TLC mode, the program operating time may be reduced. In addition, since the width of the threshold voltage distribution is reduced, reliability of the program operation may be improved.

Figure 11:
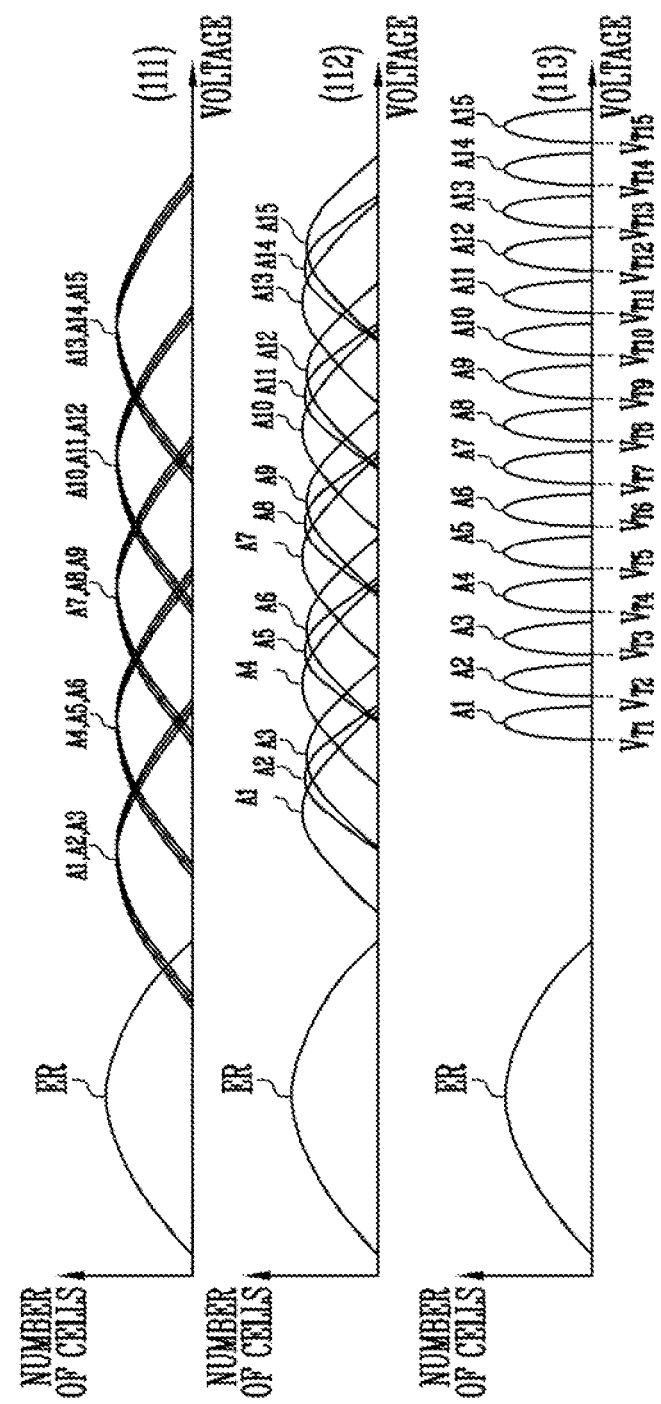
FIG. 11 is a diagram illustrating a program method using a quadruple level cell mode according to an embodiment of the present invention.

FIG. 11 is a diagram illustrating a program method using a quadruple level cell (QLC) mode according to an embodiment of the present invention.

Referring to FIG. 11, the program method using the QLC mode may also be performed by using the above-described program method using the TLC mode. For example, by performing the first program operation 111, among the first to fifteenth memory cells A1 to A15 having the erase state ER, the threshold voltages of the first to third memory cells A1 to A3 may be increased at the same time and the threshold voltages of the fourth to sixth memory cells A4 to A6 may be increased at the same time, and the threshold voltages of the seventh to ninth memory cells A7 to A9 may be increased at the same time, and the threshold voltages of the tenth to twelfth memory cells A10 to A12 may be increased at the same time, and the threshold voltages of the thirteenth to fifteenth memory cells A13 to A15 may be increased at the same time. The threshold voltages of the memory cells in each group may be performed by applying the program pulse to the selected word line once. The first program operation 111 shown in FIG. 11 may be performed with reference to the first program operation 51 shown in FIG. 5.

When the first program operation 111 is completed, a verify operation using different verify voltages may be performed on first to fifteenth memory cells A1 to A15. The verify operation may be performed with reference to the first to third verify operations 52 to 54 shown in FIG. 5.

The first to fifteenth memory cells A1 to A15 may be divided into different threshold voltage distributions by performing the second program operation 112. The second program operation 112 shown in FIG. 11 may be performed with reference to the second program operation 55 shown in FIG. 5.

A third program operation 113 may be performed so that the threshold voltages of the first to fifteenth memory cells A1 to A15 may reach target levels $V_{T1}$ to $V_{T15}$, respectively. The third program operation 113 shown in FIG. 11 may be performed by an ISPP scheme in substantially the same manner as the third program operation 56 shown in FIG. 5. The program pulse and the verify voltage may be set as described above in FIG. 9.

The above-described program method may be applied to a program method for more threshold voltage distributions than QLC in addition to TLC or QLC.

Figure 12:
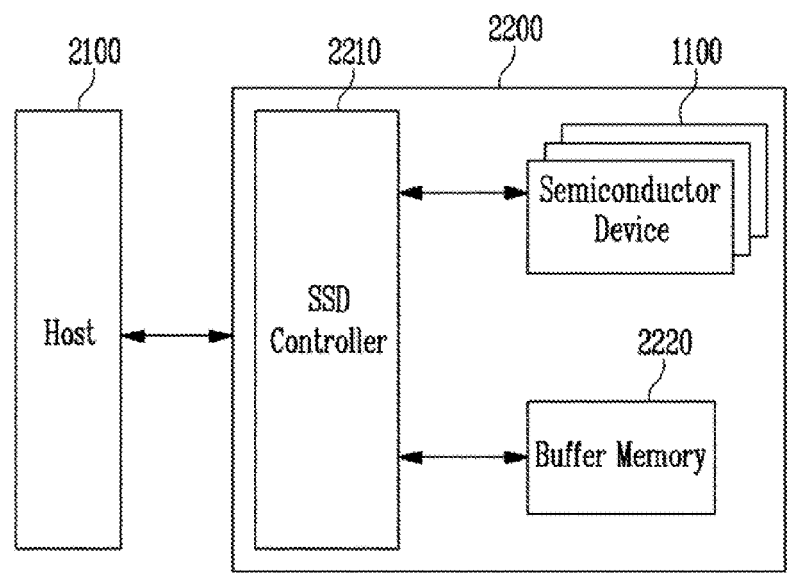
FIG. 12 is a block diagram illustrating a solid state drive including a semiconductor memory device according to an embodiment of the present invention.

FIG. 12 is a block diagram illustrating a solid state drive (SSD) including a semiconductor device according to an embodiment of the present invention.

Referring to FIG. 12, a drive device 2000 may include a host 2100 and an SSD 2200. The SSD 2200 may include an SSD controller 2210, a buffer memory 2220 and a semiconductor device 1100.

The SSD controller 2210 may provide a physical connection between the host 2100 and the SSD 2200. In other words, the SSD controller 2210 may perform interfacing with the SSD 2200 in response to a bus format of the host 2100. The SSD controller 2210 may decode a command provided from the host 2100. According to a decoding result, the SSD controller 2210 may access the semiconductor device 1100. As the bus format of the host 2100, Universal Serial Bus (USB), Small Computer System Interface (SCSI), Peripheral Component Interconnect Express (PCI-E), Advanced Technology Attachment (ATA), Parallel ATA (DATA), Serial ATA (SATA), and Serial Attached SCSI (SAS) may be included.

The buffer memory 2220 may temporarily store program data provided from the host 2100 or data read from the semiconductor device 1100. When a read request is made by the host 2100 and data in the semiconductor device 1100 is cached, the buffer memory 2220 may support a cache function to directly provide the cached data to the host 2100. In general, a data transfer speed by the bus format (for example, SATA or SAS) of the host 2100 may be higher than a transfer speed of a memory channel of the SSD 2200. In other words, when an interface speed of the host 2100 is higher than the transfer speed of the memory channel of the SSD 2200, performance degradation caused by the speed difference may be minimized by providing the buffer memory 2220 having a large capacity. The buffer memory 2220 may be provided as synchronous DRAM in order to provide sufficient buffering in the SSD 2200.

The semiconductor device 1100 may be provided as a storage medium of the SSD 2200. For example, the semiconductor device 1100 may be provided as a nonvolatile memory device having large storage capacity as described above in detail with reference to FIG. 1. The semiconductor device 1100 may be provided as a NAND-type flash memory, among nonvolatile memories.

FIG. 13 is a block diagram illustrating a memory system 3000 including a semiconductor device according to an embodiment of the present invention.

Referring to FIG. 13, the memory system 3000 according to an embodiment may include a memory control unit 3100 and a semiconductor device 1100.

Since the semiconductor device 1100 may be configured in substantially the same manner as the semiconductor device shown in FIG. 1, a detailed description of the semiconductor device 1100 is omitted.

The memory control unit 3100 may be configured to control the semiconductor device 1100. An SRAM 3110 may be used as a working memory of a CPU 3120. A host interface (I/F) 3130 may include a data exchange protocol of a host electrically coupled with the memory system 3000. An error correction circuit (ECC) 3140 in the memory control unit 3100 may detect and correct an error in data read from the semiconductor device 1100. A semiconductor I/F 3150 may interface with the semiconductor device 1100. The CPU 3120 may perform a control operation for data exchange of the memory control unit 3100. In addition, although not illustrated in FIG. 13, a ROM (not shown) for storing code data for interfacing with a host may be provided in the memory system 3000.

In an embodiment, the memory system 3000 may be applied to one of a computer, an Ultra Mobile PC (UMPC), a workstation, a net-book, a PDA, a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 14:
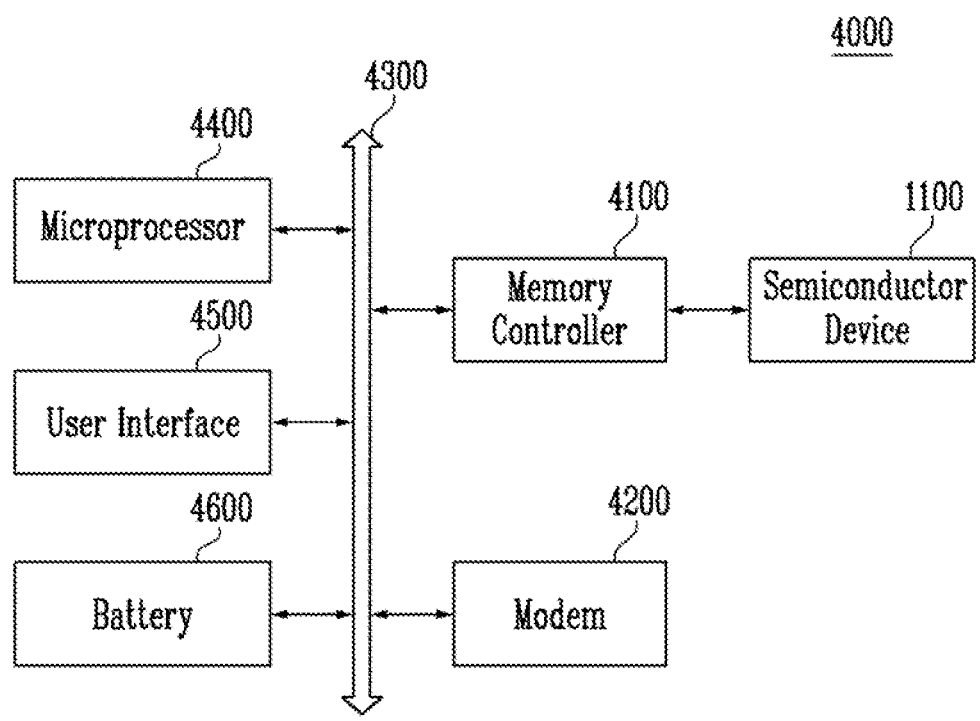
FIG. 14 is a schematic configuration of a computing system including a semiconductor memory device according to an embodiment of the present invention.

FIG. 14 is a schematic block diagram illustrating a computing system including a semiconductor device according to an embodiment of the present invention.

Referring to FIG. 14, the computing system 4000 may include the semiconductor device 1100, a memory controller 4100, a modem 4200, a microprocessor 4400, and a user interface 4500 electrically coupled to a bus 4300. When the computing system 4000 is a mobile device, a battery 4600 for supplying an operation voltage of the computing system 4000 may be additionally provided. Though not shown in FIG. 9, the computing system 4000 may include an application chip set (not shown), a camera image processor (CIS) (not shown) and a mobile DRAM (not shown), and the like.

The semiconductor device 1100 may be configured in substantially the same manner as the semiconductor device 1100 shown in FIG. 1. Thus, a detailed description thereof will be omitted.

The memory controller 4100 and the semiconductor device 1100 may constitute a Solid State Drive/Disk (SSD).

The semiconductor device 1100 and the memory controller 4100 may be mounted using various types of packages. For example, the semiconductor device 1100 and the memory controller 4100 may be mounted using packages such as Package on Package (PoP), Ball Grid Array (BGA), Chip Scale Package (CSP), Plastic Leaded Chip Carrier (PLCO), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), Wafer-level Processed Stack Package (WSP), and the like.

According to embodiments of the present invention, life of a semiconductor memory device may be prevented from being shortened by reducing a program operating time, and reliability of a program operation may be improved by reducing a threshold voltage distribution width of programmed memory cells.

In the drawings and specification, there have been disclosed typical exemplary embodiments of the invention and, although specific terms are employed, they are used in a generic and descriptive sense only and not for the purpose of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of operating a semiconductor memory device, the method comprising:
    performing a first program operation to simultaneously increase threshold voltages of memory cells having different target program levels to sub-levels lower than the different target program levels, by applying a first program pulse once to a selected word line coupled to the memory cells to be programmed, without a verify operation;
    verifying the memory cells by using different verify voltages, respectively;
    performing a second program operation to divide the threshold voltages of the memory cells; and
    performing a third program operation to increase the threshold voltages of the memory cells to the different target program levels, respectively.

2. The method of claim 1, wherein the first program operation is performed for the threshold voltages of the memory cells to have the same distribution.

3. The method of claim 1, wherein during the verifying of the memory cells, the different verify voltages are set to be higher than a lowest voltage, among threshold voltages of memory cells to be verified by each of the different verify voltages, and lower than the different target program levels, respectively.

4. The method of claim 3, wherein the memory cells are verified to be fail as a result of the verifying of the memory cells.

5. The method of claim 1, wherein the performing of the second program operation comprises:
    applying a second program pulse to the selected word line coupled to the memory cells.

6. The method of claim 5, wherein the second program operation is performed without a verify operation.

7. The method of claim 5, wherein the second program pulse is set to a higher level than the first program pulse.

8. The method of claim 1, wherein the third program operation is performed by an Incremental Step Pulse Program (ISPP) scheme.

9. The method of claim 8, wherein the performing of the third program operation comprises:
    applying a third program pulse to a selected word line coupled to the memory cells to increase the threshold voltages of the memory cells; and
    verifying the memory cells.

10. A semiconductor memory device, comprising:
    a memory cell array including a plurality of memory cells storing data;
    a peripheral circuit suitable for performing program, read and erase operations on the plurality of memory cells; and
    a control circuit suitable for controlling the peripheral circuit to perform a first program operation to increase threshold voltages of first memory cells having different target program levels, among the memory cells, to sub-levels lower than the different target program levels at the same time, by applying a program pulse once to a selected word line coupled to the first memory cells to be programmed, without a verify operation, to verify the first memory cells by using different verify voltages, respectively, to perform a second program operation to divide the threshold voltages of the first memory cells, and to perform a third program operation to increase the threshold voltages of the memory cells to be greater than the different target program levels, respectively.

11. The semiconductor memory device of claim 10, wherein the control circuit controls the peripheral circuit to perform an erase operation for the first memory cell to have an erase state and perform the first program operation without performing a verify operation.

12. The semiconductor memory device of claim 11, wherein when the first memory cells are verified, the control circuit controls the peripheral circuit to use the different verify voltages which are higher than a lowest voltage, among threshold voltages of memory cells to be verified by each of the different verify voltages, and lower than the different target program levels, respectively.

13. The semiconductor memory device of claim 10, wherein the control circuit controls the peripheral circuit to perform the second program operation by applying a program pulse to a selected word line coupled to the first memory cells.

14. The semiconductor memory device of claim 10, wherein the control circuit controls the peripheral circuit to perform the third program operation by an Incremental Step Pulse Program (ISPP) scheme.

15. The semiconductor memory device of claim 10, wherein the control circuit controls the peripheral circuit to skip a verify operation during the first and second program operations and to perform the verify operation during the third program operation.

* * * * *